United States Patent [19]
Doi

[11] Patent Number: 5,656,334
[45] Date of Patent: Aug. 12, 1997

[54] PLASMA TREATING METHOD

[75] Inventor: Hirushi Doi, Tokyo, Japan

[73] Assignee: Anelva Corporation, Fuchu, Japan

[21] Appl. No.: 727,298

[22] Filed: Oct. 8, 1996

Related U.S. Application Data

[62] Division of Ser. No. 643,945, May 7, 1996.

[30] Foreign Application Priority Data

Oct. 5, 1995 [JP] Japan .................................. 7-136001

[51] Int. Cl.$^6$ ...................................................... B05D 3/00
[52] U.S. Cl. ............................ 427/444; 427/314; 427/532; 427/573
[58] Field of Search ..................... 427/444, 314, 427/532, 573

[56] References Cited

FOREIGN PATENT DOCUMENTS

| | | |
|---|---|---|
| 58-53833 | 3/1983 | Japan . |
| 2-38470 | 3/1990 | Japan . |
| 5-94971 | 4/1993 | Japan . |
| 6-66297 | 8/1994 | Japan . |

*Primary Examiner*—Bernard D. Pianalto
*Attorney, Agent, or Firm*—Burns, Doane, Swecker & Mathis, LLP

[57] ABSTRACT

The present invention is directed to a plasma treating apparatus, for generating plasma in a dielectric container and for treating the surface of a substrate with the plasma generated, which includes a hot air heating system for heating the dielectric container by blowing hot air to a central location on the outside surface of the dielectric container.

The present invention is further directed to a plasma treating method for generating plasma in a dielectric container and for treating the surface of a substrate with the plasma generated which includes hot air heating for heating the dielectric container by blowing hot air to the outside surface of the dielectric container to a temperature at which a thin film does not deposit on the inside surface of the dielectric container.

5 Claims, 3 Drawing Sheets

PLASMA TREATING METHOD

This application is a divisional of application Ser. No. 08/643,945, filed May 7, 1996.

BACKGROUND OF THE INVENTION

1. Field of the Invention

The present invention relates to a plasma treating apparatus and a plasma treating method for applying a predetermined treatment on a substrate surface by using plasma generated in a dielectric container.

2. Description of the Related Art

Various types of plasma treatments, for example, plasma etching and chemical vapor phase deposition (CVD), are known for treating substrates. Apparatuses using plasma generated in a dielectric container have also been used for substrate treatment. In recent years, apparatuses using helicon wave excited plasma have been intensively used as apparatuses which are able to form low-pressure high-density plasma, among such apparatuses forming plasma in the dielectric container.

FIG. 4 is a cross-sectional view illustrating an outline of a plasma treating apparatus using helicon wave excited plasma as an embodiment of a conventional plasma treating apparatus. The apparatus shown in FIG. 4 has a vacuum chamber 1 with a pumping system 11, a substrate holder 2 for holding a substrate 20 at a predetermined position in the vacuum chamber 1, and a dielectric container 3 in which plasma used for the treatment of the substrate 20 is generated.

The vacuum chamber 1 has an opening at the top wall facing the substrate 20 on the substrate holder 2. The dielectric container 3 is a cylindrical member of which one end is an opening and the other end is formed to a semi-spherical shape. The dielectric container 3 is provided on the top wall of the vacuum chamber 1 so as to mount the periphery of the opening of the dielectric container 3 onto the periphery of the opening of the top wall of the vacuum chamber 1.

A helical antenna 41 is provided at the circumference of the dielectric container 3 for applying high frequency electric power inside the dielectric container 3. The antenna 41 connects with a high frequency power source 43 through a matching device 42 so that a predetermined high frequency electric power is guided into the dielectric container through the antenna 41. A magnetic field generating means 5 comprising an electromagnet is provided at the circumference of the antenna 41. The magnetic field generating means 5 generates a magnetic field in the dielectric container to generate helicon wave excited plasma. The vacuum chamber 1 also has a gas inlet system 6 to introduce a gas for generating plasma.

In the conventional plasma treating apparatus as shown in FIG. 4, a gas is introduced into the vacuum chamber 1 from the gas inlet system, and high frequency electric power is guided into the dielectric container from the antenna 41. A helical induction field is generated in the dielectric container 3 by means of the helical antenna 41. Thus, the helicon wave excited plasma is generated, and the substrate 20 is subjected to a plasma treatment.

For example, plasma etching is carried out by generating the above-mentioned plasma while introducing an etching gas, or by adding an etching gas into a plasma-generating gas.

The helicon wave excited plasma is a low-pressure high-density plasma generated according to a principle that electromagnetic waves having a frequency lower than that of plasma propagate in the plasma without decay when a strong magnetic field is applied.

In such a plasma treating apparatus, an organic thin film may deposit on the inside surface of the dielectric container. In a plasma etching apparatus, for example, a resist film comprising organic materials is deposited on the surface of the substrate. Although the resist film is resistant to plasma, the film partly evaporates when the film is exposed to high-temperature, high-density plasma. A part of the evaporated resist film adheres to the inside surface of the dielectric container after floating in the space in the dielectric container. The organic thin film deposits on the inside surface of the dielectric container due to the proceeded adhesion of the evaporated resist film.

When the deposited film grows to a certain thickness, the thin film will peel away from the inside surface of the dielectric container and fall upon the substrate which is provided just under the dielectric container, as shown in FIG. 4. The fallen thin film on the substrate causes defects of the semiconductor circuit formed on the substrate, such as a disconnection or shortening of the circuit. Further, when a conductive organic thin film deposits on the inside surface of the dielectric container, the high frequency electric power may be extraordinarily guided into the dielectric container. Moreover, when plasma emission photospectrometry through the dielectric container is carried out, the deposited film may shade light emitted by plasma, resulting in unsuccessful photospectrometry.

A thin film of material other than the material for the resist film is also deposited on the inside surface of the dielectric container. For example, in recent dry etching, an organic gas, such as $C_3F_8$, $C_4F_8$ or $CH_2F_2$, is used to improve the selectivity to the substrate material. It is known that such organic gas partly decomposes due to plasma, adheres to the inside surface of the dielectric container, and finally deposits an organic thin film. Etching of an organic thin layer formed on the substrate surface and thin film deposition by CVD using an organic gas may also deposit an organic thin film on the inside surface of the dielectric container.

Periodic cleaning is carried out to remove the deposited film, so that the above-mentioned problem does not occur. However, such cleaning process requires suspending plasma treatment. Heavy deposition will require much time for cleaning and decrease the productivity of the apparatus. To suppress the deposition of the organic thin film, heating the dielectric container with a heating wire during the treatment is proposed, as described in Japanese Patent Laid-Open Nos. 58-53833 and 5-94971, and Japanese utility model Laid-open No. 2-38470.

In the method for suppressing the deposition of the thin film described in Japanese Patent Laid-Open No. 58-53833, when the high frequency electrode of the antenna is provided at the circumference of the dielectric container like the device generating helicon wave excited plasma, the high frequency electric power radiated from the antenna may not effectively couple with plasma due to the heater provided near the dielectric container. Any means for not interrupting the propagation of the high frequency electric power, for example, a compact heater, or a plurality of divided heaters, may be used in order to solve the problem. However, it is hard to uniformly heat the dielectric container by such means. Further, since the antenna must be thermally insulated so as not to be heated excessively, the structure of such an apparatus would be complicated.

In the above-mentioned Japanese Patent Laid-Open No. 5-94971, the deposition can be suppressed by heating the dielectric container with warm water to 80° C. However, it is substantially difficult to suppress the deposition of the organic thin film on the dielectric container by heating to a temperature around 80° C. This method has another drawback in that a larger area is needed to provide the apparatus with a system for supplying and circulating warm water. When the dielectric container integrated with a water-circulating pipe is made of quartz, warm water may leak into the vacuum chamber through cracks caused due to unexpected damage of the dielectric container, resulting in much labor and time for cleaning the vacuum chamber.

Heating the plasma-generating container has been used with microwave powered etching devices, as shown in Japanese Utility Model Laid-Open 2-38470.

Regardless of whether a single wafer processing apparatus or a batch apparatus is employed, the same or different kinds of plasma treatments are repeated in one plasma deposition apparatus. After completion of one plasma treatment, gases used and formed during the treatment still remain in the vacuum chamber. Heating processes disclosed in the above-mentioned patents and utility model do not include heating of the dielectric container during the time period in which the plasma treatment is halted. The dielectric container will be cooled by outgoing radiation after the treatment. As a result, the thin film will easily deposit on the inside surface of the dielectric container due to the remaining gases.

Although such a problem may be reduced more or less by evacuating the vacuum chamber after the treatment, perfect removal of the remaining gases requires a long period of time, resulting in an unsatisfactory decrease in productivity.

SUMMARY

The foregoing drawbacks have been solved by the present invention. It is an object of the present invention to provide a simple heating system for a dielectric container. It is another object of the present invention to provide a heating process which can prevent the deposition of a thin film on the dielectric container after the treatment.

In an embodiment of the present invention to achieve the above objects, a plasma treating apparatus for generating plasma in a dielectric container and for treating the surface of a substrate with the plasma generated, comprises a hot air heating system for heating the dielectric container by blowing hot air to the outside surface of the dielectric container. The hot air heating system comprises a heat source, an air blower for supplying the hot air to the outside surface of the dielectric container through the heat source, and a guide plate for guiding the hot air from the air blower to the outside surface of the dielectric container. The heat source is provided at a position in which power supply into the dielectric container is not interrupted. The guide plate forms a closed air duct so as not to heat members other than the dielectric container.

An antenna for applying high frequency electric power into the dielectric container is provided at the circumference of the dielectric container. An auxiliary guide member comprising a dielectric member for flowing hot air along the outside surface of the dielectric container, is provided upon the antenna and inside the antenna. The auxiliary guide member is integrated with the dielectric container as a part of the dielectric container and does not contact the antenna.

In another embodiment of the present invention to achieve the above objects, a plasma treating method, for generating plasma in a dielectric container and for treating the surface of a substrate with the plasma generated, comprises hot air heating for heating the dielectric container by blowing hot air to the outside surface of the dielectric container to a temperature at which a thin film does not deposit on the inside surface of the dielectric container. The hot air heating is carried out so as to heat the dielectric container to a temperature of about 150° C. or more. The hot air heating is carried out between after a first plasma treatment and before a second plasma treatment.

DESCRIPTION OF TEE PREFERRED EMBODIMENTS

Embodiments of this invention will be explained.

Figure 1:
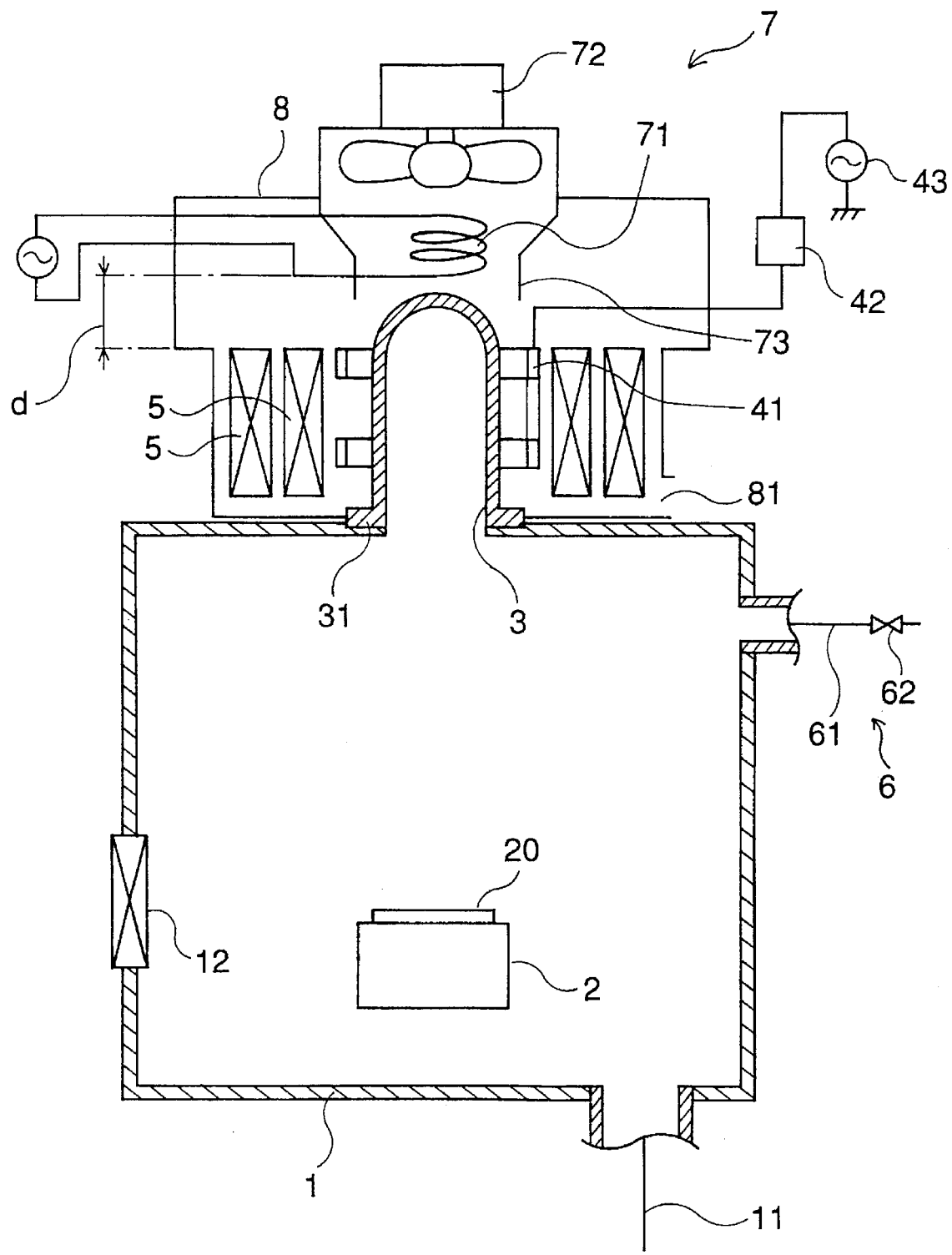
FIG. 1 is a cross-sectional view of a first embodiment of a plasma treating apparatus of the present invention.

FIG. 1 is an outlined cross-sectional view of a first embodiment of a plasma treating apparatus of the present invention. The plasma treating apparatus shown in FIG. 1 includes a vacuum chamber 1 with a pumping system 11, a substrate holder 2 for placing a substrate 20 at a predetermined position in the vacuum chamber 1, and a dielectric container 3 for generating plasma. The plasma treating apparatus further includes a hot air heating system 7 for blowing hot air to the outside surface of the dielectric container 3.

The dielectric container 3 is a cylindrical member of which one end is open and the other end is formed to a semi-spherical shape. The opening of the dielectric container 3 is attached at the opening on the top wall of the vacuum chamber 1 by means of a flange 31 provided at the periphery of the opening of the dielectric container 3. The opening on the top wall of the dielectric container 3 is provided right above the substrate 20, and the size of the opening is substantially the same as the size of the substrate holder 2.

The dielectric container 3, made of quartz glass or insulating ceramic, is approximately 2.5 mm in thickness, 100 mm in outside diameter, and 200 mm in height.

A helical antenna 41 having a diameter of around 160 mm is provided at the circumference of the dielectric container 3 for generating helicon wave excited plasma inside the dielectric container 3. The antenna 41 connects with a high frequency power source 43 through a matching device 42 so that high frequency electric power is applied into the dielectric container 3. The high frequency electric power is applied into the dielectric container 3 through the antenna 41 at 13.56 MHz and approximately, less than 3 kW. The distance between the antenna 41 and the dielectric container 31 is approximately 5 to 10 mm.

An electromagnet 5 as a magnetic field generating means is provided at the circumference of the antenna 41. The electromagnet 5 generates a direct magnetic field in the dielectric container 3 for achieving helicon wave excited plasma. The magnetic field generated by the electromagnet 5 is around 100 gauss near the central axis of the dielectric container 3.

The vacuum chamber 1 has a gas inlet system 6 to introduce a gas for generating plasma. The gas inlet system 6 includes a gas reservoir, not shown in the figure, a main pipe 61 for connecting the gas reservoir with the vacuum chamber 1, a valve 62 provided with the main pipe 61, and a mass flow controller not shown in the figure. The gas introduced is determined by the kind of plasma treatment. For example, in etching of silicon oxide film, a gas mixture of a reactive gas, such as $C_3F_8$, $C_4F_8$ or $CH_2F_2$, with a carrier gas, such as hydrogen, may be used.

The substrate holder 2 for holding the substrate 20 is provided just under the dielectric container 3. The substrate 20 on the substrate holder 2 can effectively receives particles, such as active species and ions, which are generated in the plasma flowing downstream from the dielectric container 3.

The pumping system 11 provided with the vacuum chamber 1 includes a diffusion pump and turbo-molecular pump. The vacuum chamber 1 is evacuated to an ultimate pressure of around $10^{-5}$ Pa through pumping system 11.

A gate valve 12 is mounted on a side wall of the vacuum chamber 1 to let the substrate 20 through. The substrate 20 is carried by a transferring means, not shown in the figure, between the vacuum chamber 1 and the outside through the gate valve 12.

The hot air heating system 7 includes a heater 71 as a heat source, an air blower 72 for supplying the hot air to the outside surface of the dielectric container 3 through the heater 71, and a guide plate 73 for guiding the hot air from the air blower to the outside surface of the dielectric container 3. The hot air heating system 7 heats the dielectric container 3 to a temperature at which the thin film does not deposit on the inside surface of the dielectric container 3 by blowing hot air to the outside surface of the dielectric container 3.

The heater 71 as a heat source is provided on the dielectric container 3. The distance d between the heater 71 and the antenna 41 is determined so as not to interrupt the supply of high frequency electric power by the antenna 41. The distance d depends on the frequency and output of the high frequency electric power. In the above mentioned high frequency electric power of 13.56 MHz and approximately 3 kW, the distance must be approximately 5 mm or more. The heater 71 comprises a coiled nichrome wire and generates Joule heat during the turning on of electricity.

The air blower 72, which is provided at the air course on the heater 71, blows the wind to the outside of the dielectric container 3 through the heater 71. The air blower 72 rotates commercial fans to generate wind. Alternatively, the wind may be generated by compressed air, instead of by the air blower. In such case, the wind generated by releasing the compressed air from the compressor to the atmosphere is sent to the outside surface of the dielectric container 3 through the heater 71. The expedient pressure of the compressed air is, for example, approximately 3 to 5 kg/cm².

The guide plate 73 directs the path of the air from the air blower 72 to the dielectric container 3 through the heater 71. The guide plate 73 has two functions. The first function is to effectively heat the-dielectric container by collecting the wind from the air blower and by increasing the wind speed. The second function is to prevent the heating of members other than the dielectric container 3 by shielding these members from the hot air. In consideration of the second function, it is preferable that the guide plate 73 forms a closed air duct so as not to leak the hot air. Further, the preferred guide plate 73 achieves a heat isolating structure, for example, by using a heat insulating material.

When using a metallic guide plate 73, a problem similar to that in conventional methods may occur in that coupling of the high frequency electric power supplied by the antenna 41 is interrupted. Therefore, the guide plate is preferably placed so as to maintain a sufficient distance from the antenna 41. A housing 8 is provided on the vacuum chamber 1 to cover the hot air heating system 7, as shown FIG. 1. An outlet port 81 is provided at the bottom of the housing 8, connecting with the top wall of the vacuum chamber 1. The outlet port 81 is connected with an exhaust duct, not shown in the figure, and evacuates the hot air which flows along the dielectric container 3 out of the apparatus.

The heating conditions of the dielectric container 3 by such a hot air heating system 7 will now be described. The heating conditions depend on the kinds of the thin films which may be deposited.

For example, when the resist film of the surface mask layer on the substrate 20 vaporizes, a heating temperature of more than 150° C. can prevent the deposition of the vaporized resist film, since the resist evaporates at a temperature of more than 120° C., i.e., the heat resisting temperature. When using an organic gas, such as $C_3F_8$, $C_4F_8$ or $CH_2F_2$, as an etching gas, carbon compounds formed by the decomposition of the organic gas deposits as a thin film. Since the deposition is observed at a temperature of less than approximately 100° C., the heating temperature is set to greater than 100° C.

The temperature for suppressing the thin film deposition depends slightly on other parameters, for example, pressure, and gas flow rate. When the heating temperature should be lowered as much as possible, the critical temperature of the dielectric container 3, at which the deposition of the thin film cannot be observed, must be experimentally determined considering other parameters set forth above.

The mechanism for suppressing the deposition of the thin film by heating will now be explained. The deposition of the thin film is suppressed by means of the decreased sticking probability of gas molecules and the decreased detaining time of the stuck gas molecules with the increased temperature of the dielectric container 3. In other words, the stuck gas molecules must stay on the inside surface of the dielectric container 3 for a given time in order to deposit as a thin film. When the temperature of the dielectric container 3 rises, the sticking probability and detaining time decrease by means of energy from the dielectric container 3. As a result, the deposition of the thin film is suppressed.

The flow rate of the hot air from the air blower 72 is generally 30 to 50 liters/min., although it depends on the temperature of the heater 71. Such a flow rate can be readily achieved by using any commercial air heater preferably having a rated voltage of 100 V and a rated power of 600 W. When supplying hot air of 500° C. to the dielectric container 3 at the flow rate of 30 to 50 liters/min., the dielectric container 3 is heated to around 200° C. after about five minutes.

When the dielectric container 3 is more rapidly heated to a given temperature, it is preferable that the heater 71 is set to a higher temperature and the flow rate of the hot air is increased. After the temperature reaches the given temperature, excessive heating of the dielectric container 3 should be prevented. Therefore, a temperature sensor is preferably provided to detect the temperature of the dielectric container 3 for feedback control of heating of the dielectric container 3. Either feedback control, i.e., regulating the flow rate by sending signals from the temperature sensor to the air blower 72, or regulating the heating value by sending signals to the heater 71, may be employed. A preferred temperature sensor is an infrared thermometer which is sensitive to radiation from the dielectric container 3.

The dielectric container 3 may also be heated by induction heating or by heating of plasma itself due to induction field of the high frequency electric power. However, such dielectric container 3 cannot be heated to a temperature at which the deposition of the thin film is suppressed. For example, in etching of aluminum, the temperature of the dielectric container 3 increases to merely 70° to 80° C. by the plasma of the high frequency electric power of 2 to 3 kW, and is far from 150° C., at which the deposition of the thin film is suppressed.

The operation of the plasma treating apparatus of the present invention will now be fully explained.

First, the substrate 20 is carried into the vacuum chamber 1 through the gate valve 12 by means of the transferring system, not shown in the figure, so that the substrate 20 is placed on the substrate holder 2. Then, the pumping system 11 evacuates the vacuum chamber 1 and the dielectric container 3, and a predetermined gas is introduced into the vacuum chamber 1 by means of the gas inlet system 6. The vacuum chamber 1 and dielectric container 3 are filled with the introduced gas. A predetermined high frequency wave is generated by means of the high frequency electric power source 43, and the generated high frequency wave is supplied to the antenna 41 via the matching device 42. The antenna 41 generates an induction field in the dielectric container 3 to form helicon wave excited plasma in the dielectric container 3. Active species and ions formed in the plasma flow downstream and reach the surface of the substrate 20. In such a way, a given treatment is carried out on the surface of the substrate 20. For example, when an etching gas, such as $C_3F_8$, $C_4F_8$, or $CH_2F_2$, is introduced from the gas inlet system to form plasma of the gas, the surface material of the substrate 20 is etched due to intensive chemical action of decomposed fluorine active species.

After repeating such plasma treatment several times, the deposition of materials, which are based on the material on the substrate 20 or are formed in the plasma, was observed as a thin film on the inside surface of the dielectric container 3 in a conventional apparatus. Such deposition was not observed in the apparatus of the present embodiment in which the dielectric container 3 is heated. In particular, by heating at more than 150° C., no deposition of the thin film was observed even after repeating the treatment several hours.

A feature of the plasma treating method of the present invention is that the dielectric container 3 is heated after the completion of a first plasma treatment and before a second plasma treatment.

As is described above, gases used or formed during the treatment remain in the vacuum chamber 1 after the first plasma treatment. When no heating step is employed to the dielectric container 3 after the plasma treatment, the remaining gases readily deposit as a thin film on the inside surface of the dielectric container 3.

In contrast, since the process of the present invention includes the heating of the dielectric container 3 during the intermittent period of the plasma treatment, such deposition is surely prevented. The heating is carried out by sending control signals to the heater 71 and the air blower 72 so as to continuously operate the heater 71 and the air blower 72 after the plasma treatment. Therefore, the operations of the heater 71 and the air blower 72 are halted only when the apparatus itself is completely halted for maintenance.

Since heating due to the high frequency electric power and plasma is not carried out after the completion of the plasma treatment, more heating will be required for the hot air heating system 7. Thus, the heating temperature of the heater 71 and the flow rate of the air blower 72 must be increased after the plasma treatment, and in the second plasma treatment, the heating temperature and the flow rate are again decreased to the original values.

A second embodiment of the plasma treating apparatus of the present invention will now be explained.

Figure 2:
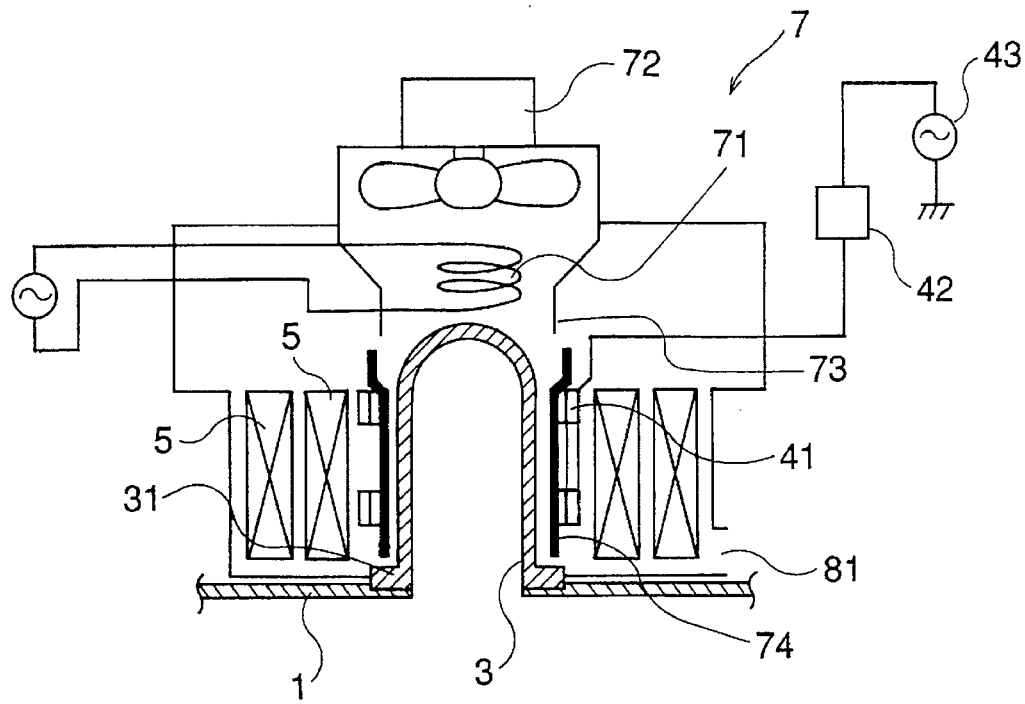
FIG. 2 is a cross-sectional view of a second embodiment of a plasma treating apparatus of the present invention.

FIG. 2 is a cross-sectional view illustrating main sections of the second embodiment of the plasma treating apparatus. Since the construction of the second embodiment differs that of the first embodiment only in the hot air heating system 7, explanations of other sections or members will be omitted.

The hot air heating system 7 in the second embodiment includes the heater 71 as the heat source, the air blower 72 for sending the wind to the outside surface of the dielectric container 3 through the heater 71, the guide plate 73 for guiding the wind from the air blower 72, similarly to the first embodiment. The hot air heating system 7 in the second embodiment further includes an auxiliary guide member 74 for sending the hot air along the outside surface of the dielectric container 3.

The auxiliary guide member 74 generally comprises the same dielectric material as the material used for the dielectric container 3. The auxiliary guide member 74 is a cylinder having a somewhat larger diameter than and a height similar to that of the dielectric container 3. In further detail, the auxiliary guide member 74 has a stepped portion at the place slightly under its top end, and the diameter of the top end is, thus, somewhat larger than that of its lower portion. The stepped portion is suspended from the top end of the antenna 41 as shown in FIG. 2 so that the auxiliary guide member 74 is placed on the antenna 41. The differential width of the stepped portion is approximately 10 mm.

Moreover, a gap is formed between the bottom end of the auxiliary guide member 74 and the flange section 31 of the dielectric container 3 so as to direct the hot air through the gap toward the outlet 81.

The provided auxiliary guide member 74 promotes the flow of the hot air along the outside surface of the dielectric container 3, thus enhancing the heating effect. The gap between the inside surface of the auxiliary guide member 74 and the outside surface of the dielectric container 3 is generally 5 to 10 mm, although it depends on the flow rate of the air blower 72. In this embodiment, since the auxiliary guide member 74 is provided in a way that it is placed on the antenna 41, the auxiliary guide member 74 can also be readily provided to antennas other than helical antennas, such as coil or ring antennas.

A third embodiment of the plasma treating apparatus of the present invention will now be explained.

Figure 3:
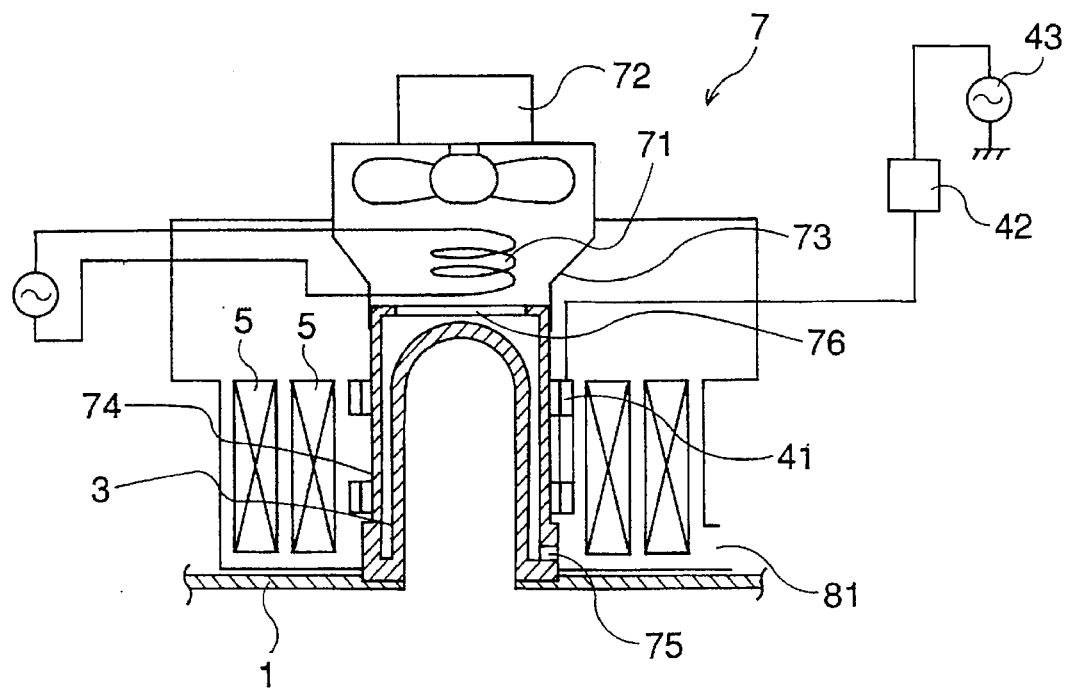
FIG. 3 is a cross-sectional view of a third embodiment of a plasma treating apparatus of the present invention.
Figure 4:
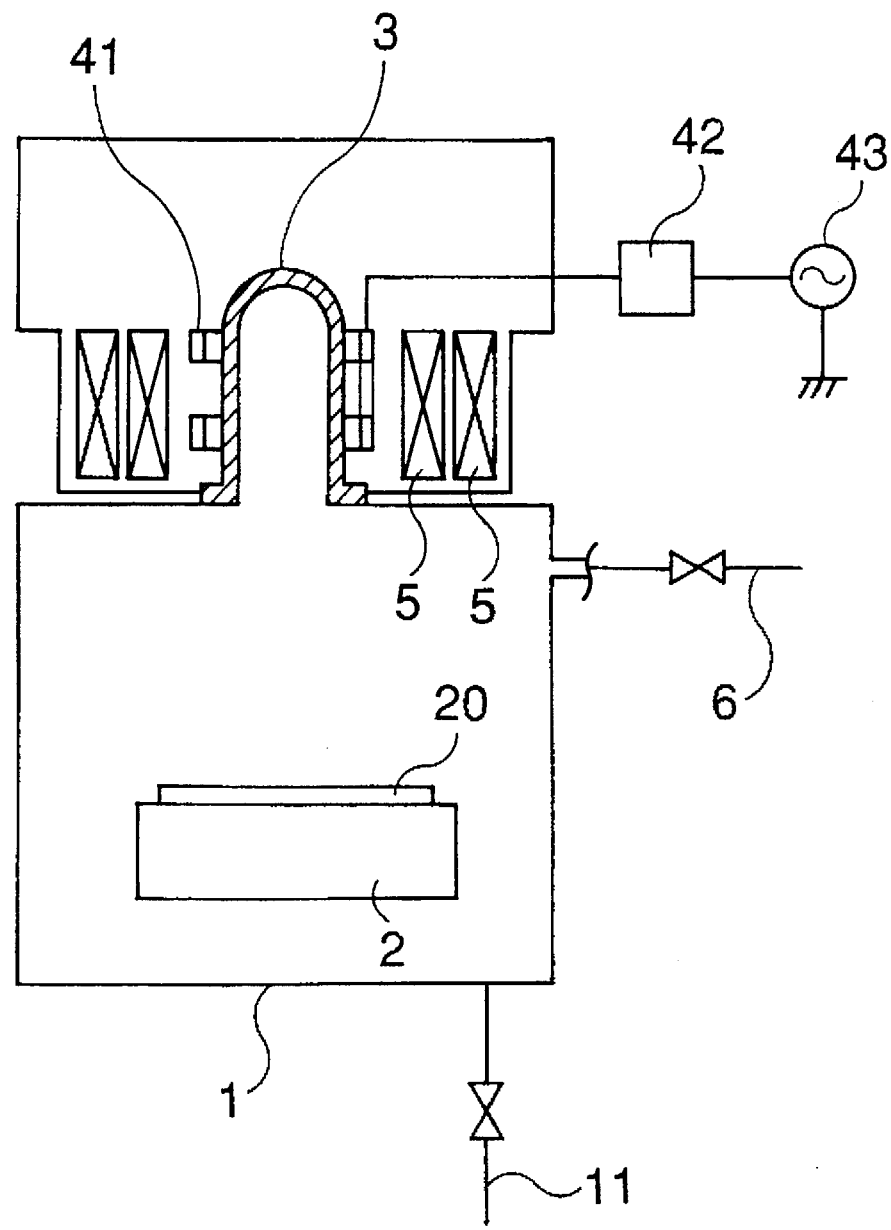
FIG. 4 is a cross-sectional view illustrating an outline of a plasma treating apparatus using helicon wave excited plasma as an embodiment of a conventional plasma treating apparatus.

FIG. 3 is a cross-sectional view illustrating main sections of the third embodiment on the plasma treating apparatus. Since the construction of the third embodiment differs from that of the first embodiment only in the hot air heating system 7, explanations of other sections or members will be omitted.

Similar to the first embodiment, the hot air heating system 7 in the third embodiment includes the heater 71 as the heat source, the air blower 72 for sending the wind to the outside surface of the dielectric container 31 through the heater 71, and the guide plate 73 for guiding the wind from the air blower 72. In the third embodiment, an auxiliary guide member 74 is formed integrally with the dielectric container 3 by using quartz glass for directing the hot air along the outside surface of the dielectric container 3. The auxiliary guide member 74 is a cylinder having a uniform diameter, and does not contact with the outer antenna, as shown in FIG. 3. A plurality of circular exit openings 75, each having a diameter of around 30 mm, are formed at the bottom section, connecting the side wall of the auxiliary guide member 74 with the dielectric container 3, at an interval of around 20 mm. A large inflow port 76 is formed at the top end of the auxiliary member 74, and the top end connects with the end of a guide plate 73 similar to the first embodiment, as shown in FIG. 1.

Similar to the second embodiment, the flow of the hot air along the outside surface of the dielectric container 3 is also promoted, so that the heating effect increases in the third embodiment. The hot air from the air blower 72 flows through the gap between the dielectric container 3 and the auxiliary guide member 74 while heating the dielectric container 3 via the inflow port 76, and is exhausted from the outlet 81 of the outer cover 8. Since the auxiliary guide member 74 does not contact the antenna 41, thus differing from the second embodiment, the antenna 41 is not heated.

In the above-mentioned embodiments, although only helicon wave excited plasma was explained as an example, other kinds of high frequency plasma, such as high frequency coil plasma, parallel plate inductive coupling plasma, and electron cyclotron resonance (ECR) discharge plasma, are also applicable to the present invention. Further, magnetron discharge plasma and direct current diode discharge plasma may be applicable.

The plasma treating method of the present invention may be applicable to CVD, sputtering, and surface modifications, such as oxidizing and nitriding, other than etching.

The substrate 20 treated may include wafers for manufacturing LSIs, glass substrates for manufacturing liquid crystal displays (LCDs), silicon substrates for manufacturing solar batteries, and substrates for manufacturing information recording media, such as hard disks.

The hot air heating is significantly effective in respect of a transparent dielectric container to which radiation heating is not effective.

A further advantage on the plasma treating apparatus of the present invention is that the supplied electric power can be effectively introduced into the dielectric container, since the heat source of the hot air blowing system is provided at the position not interrupting the introduction of the power. Therefore, the plasma treating apparatus can be preferably applied to an etching process requiring high anisotropy or selectivity in low pressure, high density plasma, such as helicon wave excited plasma.

Moreover, since members other than the dielectric container are not unnecessarily heated, damage due to heating is avoidable.

The plasma treating apparatus of the present invention can effectively perform hot air heating by means of the guide plate. The auxiliary guide member further improves the heating effect by promoting the flow of the hot air along the outside surface of the dielectric container. Since the auxiliary guide member is placed on the antenna, it can be provided to conventional apparatuses with an antenna. Further, since the auxiliary guide member does not contact the antenna, excessive heating of the antenna can be prevented.

According to the plasma treating method of the present invention, the deposition of the thin film due to gases, which remain after the completion of the treatment, can be suppressed because the dielectric container is heated during intermitted periods of the plasma treatment.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A plasma treating method for treating the surface of a substrate with plasma, comprising:

generating plasma in a dielectric container having an outside surface and an antenna adjacent said outside surface;

heating hot air;

blowing the heated hot air to a central location on the outside surface of the dielectric container until the dielectric container is uniformly heated to a temperature at which a thin film does not deposit on an inside surface of the dielectric container.

2. The plasma treating method of claim 1, wherein the hot air is blown between the antenna and the outside surface of the dielectric container.

3. The plasma treating method of claim 1, wherein the dielectric container is heated to a temperature of about 150° C., or more.

4. The plasma treating method according to claim 1, wherein the hot air heating is carried out after a first plasma treatment and before a second plasma treatment.

5. The plasma treating method of claim 1, wherein the plasma is generated using high frequency power.

* * * * *